(12) United States Patent
Pujol

(10) Patent No.: US 7,932,706 B2
(45) Date of Patent: Apr. 26, 2011

(54) SINGLE INPUT DUAL OUTPUT VOLTAGE POWER SUPPLY AND METHOD THEREFOR

(75) Inventor: Alexandre Pujol, Toulouse (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 817 days.

(21) Appl. No.: 11/912,795

(22) PCT Filed: Jan. 10, 2007

(86) PCT No.: PCT/US2007/060299
§ 371 (c)(1),
(2), (4) Date: Oct. 26, 2007

(87) PCT Pub. No.: WO2008/085519
PCT Pub. Date: Jul. 17, 2008

(65) Prior Publication Data
US 2009/0302950 A1    Dec. 10, 2009

(51) Int. Cl.
*G05F 1/00*    (2006.01)

(52) U.S. Cl. ....................................................... 323/273
(58) Field of Classification Search .................. 323/273, 323/282, 283; 363/60, 61
See application file for complete search history.

(56) References Cited

U.S. PATENT DOCUMENTS

| | | | |
|---|---|---|---|
| 6,317,122 B1 * | 11/2001 | Yamazaki | 345/211 |
| 7,030,699 B2 * | 4/2006 | Richard et al. | 330/297 |
| 2007/0229169 A1 | 10/2007 | Doy et al. | |

* cited by examiner

*Primary Examiner* — Adolf Berhane
*Assistant Examiner* — Yemane Mehari
(74) *Attorney, Agent, or Firm* — Robert F. Hightower

(57) ABSTRACT

In one embodiment, a power supply controller is configured to form both positive and negative supply voltages from a single input voltage so the maximum differential voltage across a load that uses the positive and negative supply voltages is no greater than the maximum value of the input voltage.

17 Claims, 3 Drawing Sheets

US 7,932,706 B2

SINGLE INPUT DUAL OUTPUT VOLTAGE POWER SUPPLY AND METHOD THEREFOR

BACKGROUND OF THE INVENTION

The present invention relates, in general, to electronics, and more particularly, to methods of forming semiconductor devices and structure.

In the past, the semiconductor industry of utilized various methods and structures to form power supply circuits that operated from a single input voltage and supplied multiple output voltages. In some systems the power supplies were used to provide operating power for operating amplifiers such as amplifiers in an audio system. Typically, the prior power supply circuits used the input voltage as one operating supply for the amplifier and internally formed a second operating supply that had a value substantially equal to the input voltage but was negative relative to ground. One such power supply circuit was disclosed in U.S. Pat. No. 7,061,328 that issued to Tony Doy on Jun. 13, 2006. One problem with these prior power supply circuits was that the amplifier had to have a breakdown voltage large enough to sustain the difference between the two operating voltage values.

Accordingly, it is desirable to have a power supply circuit that provides a smaller differential between the maximum and minimum voltage values supplied by the power supply circuit and that can provide power to an audio amplifier system.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
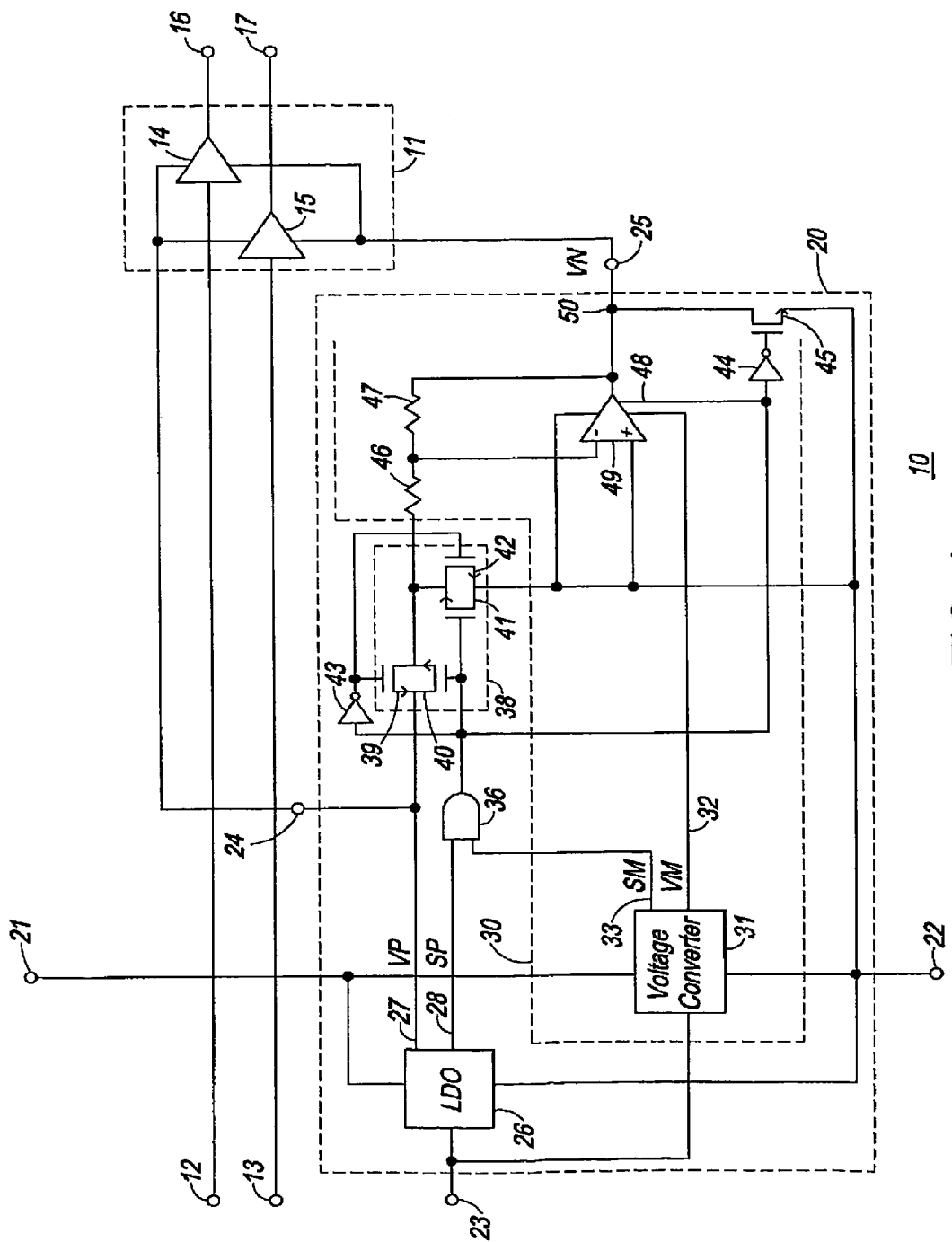
FIG. 1 schematically illustrates an embodiment of a portion of an amplifier system that includes a power supply circuit in accordance with the present invention.

FIG. 1 schematically illustrates an embodiment of a portion of an amplifier system 10 that includes a power supply circuit 20. Power supply circuit 20 provides operating power for an amplifier circuit 11. For the embodiment illustrated in FIG. 1, amplifier circuit 11 includes two amplifiers illustrated as an amplifier 14 and an amplifier 15. Amplifier 14 receives an input signal that is to be amplified on an input terminal 12 and provides an output signal on an output 16. Amplifier 15 receives an input signal that is to be amplified on an input terminal 13 and provides an output signal on an output 17. Although amplifier circuit 11 is illustrated with two amplifiers, circuit 11 may have only one amplifier or may have any number of amplifiers. In the preferred embodiment, amplifiers 14 and 15 are audio amplifiers that amplify audio input signals.

Power supply circuit 20 receives power for operating circuit 20 from a single input voltage applied between a voltage input 21 and a common voltage return 22. As will be seen further hereinafter, circuit 20 is configured to receive the input voltage and form both positive and negative voltages wherein the maximum voltage potential between the positive and negative voltages is no greater than the maximum value of the input voltage. For example, input 21 may be connected to a positive terminal of a battery and return 22 may be connected to the negative terminal of the battery. Return 22 typically is connected to a potential that is used for a ground reference for system 10. Circuit 20 includes a voltage regulator circuit or regulator 26, a conversion circuit 30, a logic circuit that has an AND gate 36 and an inverter 43, and a protection circuit that includes a switch circuit 38, an inverter 44, and a transistor 45. Conversion circuit 30 includes a voltage converter 31, and an amplifier 49 along with resistors 46 and 47 that form a second regulator circuit.

Regulator 26 generally is a linear regulator, such as a low drop out (LDO) regulator. Such linear regulators are well known to those skilled in the art. Regulator 26 is configured to receive the input voltage from input 21 and responsively form a positive voltage (VP) on an output 27 of regulator 26. The positive voltage (VP) is also provided on an output 24 of circuit 20. Regulator 26 regulates the value of the positive voltage (VP) to a desired value that is less than the value of the input voltage received on input 21. For example, the voltage received on input 21 may be approximately five volts (5 V) and the desired value of the positive voltage (VP) may be approximately two and one-half volts (2.5 V). The desired value of the positive voltage is regulated to a target value within a range of values around the-target value. For example, the target value may be two and one-half volts (2.5 V) and the range of values may be plus or minus five percent (5%) around the two and one-half volts (2.5 V). Regulator 26 also forms a positive status (SP) signal on an output 28 that is representative of the status of the positive voltage (VP). The SP signal is asserted or high if the value of VP is within the range of values.

Voltage converter 31 receives the value of the input voltage between input 21 and return 22 and forms a minus voltage (VM) on an output 32 of converter 31. The value of the minus voltage (VM) is negative relative to the value of the potential on return 22. The magnitude of the VM signal is sufficient to form an operating voltage for amplifier 49. Additionally, as will be seen further hereinafter, the magnitude of VM is large enough to facilitate amplifier 49 forming a negative voltage VN that is used for operating amplifier circuit 11. Converter 31 may be any one of a variety of voltage converter circuits that receives a positive voltage and forms a negative voltage. For example, voltage converter 31 may be a charge pump circuit. Converter 31 also is configured to form a minus status (SM) signal on an output 33 of converter 31 that is representative of the status of VM. The SM signal is asserted or high if the value of the VM signal is within the target range. The range of values around the target value is no less than the magnitude of VN plus the voltage dropped from the VM input to the output of amplifier 49. Circuit 20 also receives a power-down (PD) signal on a PD input 23. The PD signal is used to disable circuit 20 from providing power on outputs 24 and 25. If the PD signal is high, regulator 26 inhibits forming the VP signal and forces the SP signal to be low or negated, and converter 31 inhibits forming the VM signal and forces the SM signal to be low or negated. If the PD signal is low, regulator 26 forms VP and asserts SP, and converter 31 forms VM and asserts SM.

In operation and assuming that the PD signal is low and that both VP and VM are within the target ranges, regulator 26 asserts the SP signal and forms the positive voltage (VP) on output 27. Converter 31 asserts the SM signal and forms the minus voltage (VM). Since both the SP and SM signals are high, the output of gate 36 is also high. The high from gate 36 enables transistor 40 and also enables transistor 39, through inverter 43. With both transistors 39 and 40 enabled, switch circuit 38 couples VP to the input of the regulator formed by amplifier 49 and resistors 46 and 47. Amplifier 49 receives the VP signal on the inverting input and receives the potential of return 22 on the non-inverting input. Amplifier 49 is connected to receive operating power between the negative voltage of VM and the voltage of return 22. Consequently, the output of amplifier 49 forms a negative voltage (VN) on the output of amplifier 49, thus, on output 25 of circuit 20. The magnitude of the negative voltage (VN) depends on the gain of amplifier 49. In the preferred embodiment, resistors 46 and 47 are equal so that amplifier 49 has a unity gain. The unity gain of amplifier 49 forms the magnitude of VN to be substantially equal to the magnitude of VP. Thus, circuit 20 is configured to form a positive voltage on output 24 and form a negative voltage on output 25 that have substantially equal magnitudes. However, because amplifier 49 receives operating power between VM and return 22, VN is negative relative to return 22 and relative to VP. Preferably, regulator 26 regulates VP to a magnitude that is no greater than approximately one-half the value of the input voltage that is received between input 21 and return 22. Because the amplifier circuit of amplifier 49 and resistors 46 and 47 has unity gain, the magnitude of VN is approximately equal to the magnitude of VP. Consequently, the maximum voltage applied across amplifier circuit 11 is no greater than the maximum value of the voltage received on input 21.

If the PD signal is low, regulator 26 inhibits forming the VP signal and negates the SP signal by forcing the SP signal low. The low PD signal also causes converter 31 to negate the SM signal by forcing the SN signal low. The low from either the SP signal or the SM signal is sufficient to force the output of gate 36 low. A low from gate 36 disables transistors 39 and 40 and enables transistors 41 and 42. Enabling transistors 41 and 42 couples the inverting input of amplifier 49 to the potential of return 22 thereby forcing the VN signal to be substantially zero, or very near to the value of return 22. Additionally, the low from the output of gate 36 enables transistor 45, through inverter 44. Enabling transistor 45 pulls output 25 to substantially the potential of return 22. Additionally, amplifier 49 is configured to decouple amplifier 49 from the operating potential provided by the VM signal and the potential return 22 thereby ensuring that the output of amplifier 49 does not drive output 25. Additionally, during start-up, the SP and SM signals remain low until respective voltages VP and VM are within the target ranges. The corresponding low SP or SM signal also inhibits circuit 20 from providing the VP and VN voltages in a manner similar to the description of PD being high. In order to provide this functionality for system 10, regulator 26 is connected between input 21 and return 22 to receive operating power. A control input of regulator 26 is connected to PD input 23. Output 27 of regulator 26 is commonly connected to a source of transistor 39, a drain of transistor 40, and output 24. Output 28 of regulator 26 is connected to a first input of gate 36. The output of gate 36 is commonly connected to an input of inverter 43, a gate of transistor 40, a gate of transistor 41, an input of inverter 44, and a control input of amplifier 49. The output of inverter 43 is commonly connected to a gate of transistor 39 and a gate of transistor 42. The output of inverter 44 is connected to a gate of transistor 45. The source of transistor 45 is connected to return 22 and a drain is connected to output 25. Converter 31 is connected to receive power between input 21 and return 22. An input of converter 31 is connected to PD input 23. The minus voltage (VM) output 32 of converter 31 is connected to the lower operating power terminal of amplifier 49. The more positive operating supply terminal of amplifier 49 is connected to return 22. A positive input of amplifier 49 is connected to return 22. An inverting input of amplifier 49 is commonly connected to a first terminal of resistor 46 and a first terminal of resistor 47. A second terminal of resistor 47 is connected to the output of amplifier 49. The second terminal of resistor 46 is commonly connected to a source of transistor 41, a drain of transistor 42, a source of transistor 40, and a drain of transistor 39. Amplifier circuit 11 is connected to receive operating power between an output 24 and output 25.

Figure 2:
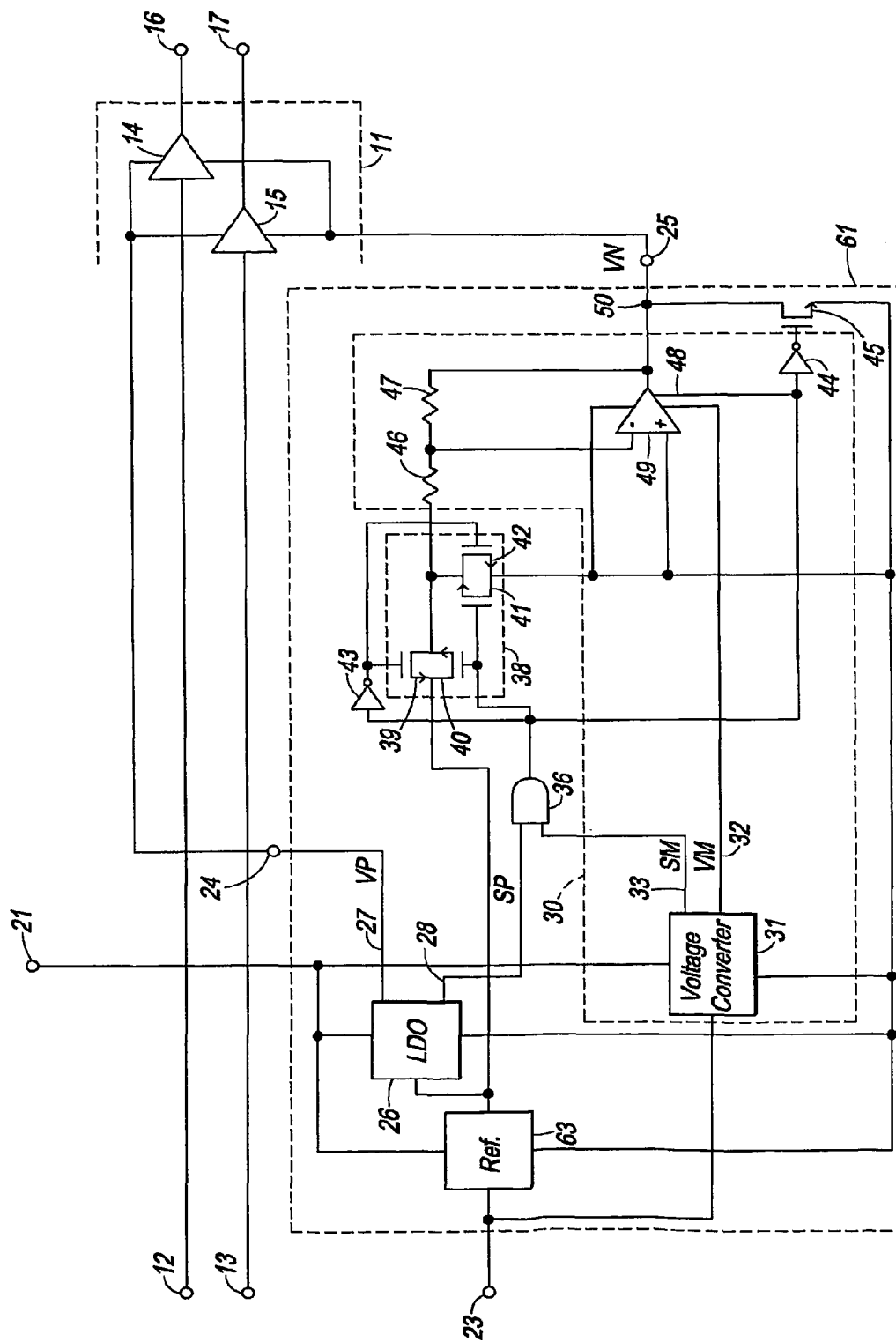
FIG. 2 schematically illustrates an embodiment of a portion of an amplifier system that includes another power supply circuit that is an alternate embodiment of the power supply circuit of FIG. 1 in accordance with the present invention.

FIG. 2 schematically illustrates an embodiment of a portion of an amplifier system 60 that includes a power supply circuit 61. Circuit 61 is an alternate embodiment of circuit 20 that was described in the description of FIG. 1. Circuit 61 is similar to circuit 20 except that circuit 61 includes a voltage reference or reference or ref 63. Reference 63 provides a highly stable voltage that is used to form VN. In the preferred embodiment, reference 63 is a bandgap reference circuit that forms a voltage reference voltage. The value of the reference voltage is generally less than the value of VP. Consequently, the amplifier that includes amplifier 49 and resistors 46 and 47 is configured to have a higher gain so that the magnitude of VN remains substantially equal to the magnitude of VP. For example, the reference voltage may be approximately 1.25 volts, thus, the gain of amplifier 49 is two so that the magnitude of VN is substantially equal to the magnitude of VP. Because the reference voltage is more stable than the voltage from regulator 26, VN is less affected by variations of the input voltage.

The goal is to configure circuit 20 so that VN is substantially equal to VP and so that the magnitude of VP plus the magnitude of VN is substantially no greater than the magnitude of the input voltage. However, as is well known in the art there are always minor variances that prevent the gains from being identically equal. It is well established in the art that variances of up to about ten percent (10%) are regarded as reasonable variances from the ideal goal of exact.

Figure 3:
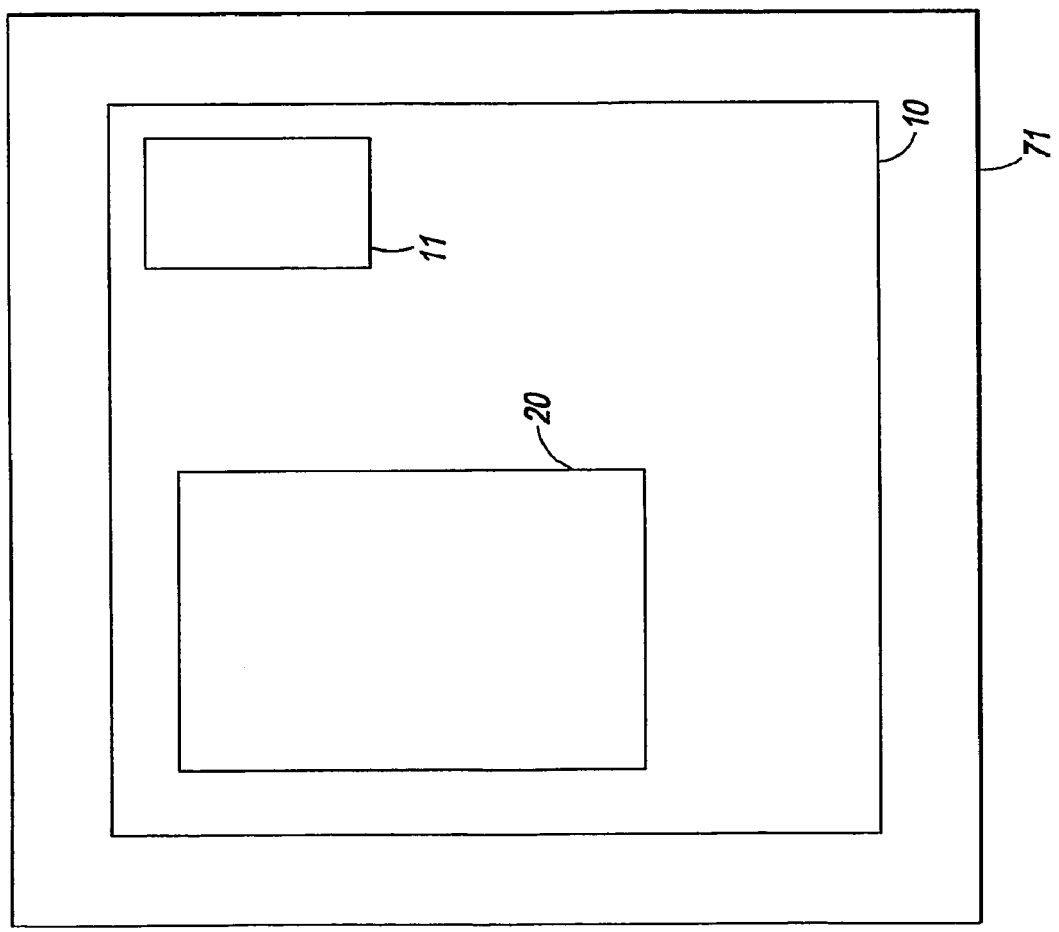
FIG. 3 schematically illustrates an enlarged plan view of a semiconductor device that includes the power supply circuit of FIG. 1 in accordance with the present invention.

FIG. 3 schematically illustrates an enlarged plan view of a portion of an embodiment of a semiconductor device or integrated circuit 70 that is formed on a semiconductor die 71. Circuit 20 is formed on die 71. Die 71 may also include other circuits that are not shown in FIG. 3 for simplicity of the drawing. Circuit 20 and device or integrated circuit 70 are formed on die 71 by semiconductor manufacturing techniques that are well known to those skilled in the art.

In view of all of the above, it is evident that a novel device and method is disclosed. Included, among other features, is forming a power supply controller to form both positive and negative supply voltages from a single input voltage so the maximum differential voltage across a load that uses the positive and negative supply voltages is no greater than the maximum value of the input voltage.

While the subject matter of the invention is described with specific preferred embodiments, it is evident that many alternatives and variations will be apparent to those skilled in the semiconductor arts. Additionally, the word "connected" is used throughout for clarity of the description, however, it is intended to have the same meaning as the word "coupled". Accordingly, "connected" should be interpreted as including either a direct connection or an indirect connection.

The invention claimed is:
1. A power supply circuit comprising:
a first input configured to receive an input voltage having a first value for operating the power supply circuit;

a return configured to form a common terminal for the input voltage wherein the first value is referenced to a potential of the return;

a first circuit configured to receive the input voltage and form a first voltage having a second value that is less than the first value, the second value having a first magnitude;

a second circuit configured to receive the input voltage and form a second voltage having a third value that is negative referenced to the potential of the return wherein a second magnitude of the third value is less than the first value;

a first regulator circuit configured to use the potential of the return and the second voltage as an operating voltage, the regulator circuit configured to receive the first voltage and form a third voltage that is negative referenced to the potential of the return and having a third magnitude that is substantially equal to the first magnitude; and a first audio amplifier configured to receive the first voltage as a positive operating voltage and the third voltage as a negative operating voltage.

2. The power supply circuit of claim 1 wherein the second circuit includes a voltage converter circuit that receives the input voltage and forms the second voltage.

3. The power supply circuit of claim 2 wherein the second circuit includes a charge pump circuit that forms the second voltage.

4. The power supply circuit of claim 1 wherein the power supply circuit receives operating power only between the first input and the return.

5. The power supply circuit of claim 1 further including an audio system configured to receive operating power between the first voltage and the third voltage wherein the first audio amplifier is a portion of the audio system.

6. The power supply circuit of claim 1 further including a start-up circuit that inhibits the regulator circuit from forming the third voltage responsively to one of the first voltage being less than the second value or the second voltage being less than the third value.

7. The power supply circuit of claim 1 wherein the first magnitude is substantially equal to the second magnitude.

8. A method of forming a power supply circuit comprising:
configuring the power supply circuit to receive a first voltage for operating the power supply circuit wherein the first voltage has a first value that is referenced to a common return of the power supply circuit;

configuring the power supply circuit to form a second voltage having a second value that is less than the first value responsively to receiving the first voltage having the first value;

configuring the power supply circuit to form a third voltage responsively to receiving the first voltage having the first value wherein the third voltage has a third value having a magnitude and having a sign that is opposite to the second voltage coupling a regulator circuit between the common return and the third voltage to receive operating power for operating the regulator circuit and configuring the regulator circuit to receive the second voltage and responsively form a fourth voltage having a fourth value, the fourth value having a magnitude that is substantially equal to the second value and having a sign that is opposite to the second voltage and wherein the second value minus the fourth value is no greater than the first value: and coupling an audio system to receive operating power between the second and fourth voltages.

9. The method of claim 8 wherein configuring the power supply circuit to form the third voltage includes coupling a voltage converter to receive the first voltage and form the third voltage having a magnitude that is greater than the fourth value.

10. The method of claim 9 further including coupling the regulator circuit to receive the third voltage and reduce the magnitude of the third voltage to the magnitude of the fourth voltage.

11. The method of claim 8 wherein coupling the regulator circuit includes coupling an amplifier to receive operating power between the third voltage and the common return and operably coupling the amplifier to receive the second voltage and form the fourth voltage.

12. The method of claim 11 wherein coupling the amplifier includes coupling a power input of the amplifier to receive the fourth voltage, coupling a power return of the amplifier to receive a voltage of the common return, coupling a first signal input of the amplifier to receive the common return voltage, and coupling a second signal input of the amplifier to receive the second voltage.

13. The method of claim 9 wherein coupling the voltage converter to receive the first voltage and form the third voltage includes coupling a charge pump circuit to form the third voltage.

14. The method of claim 8 wherein configuring the power supply circuit to form the second voltage includes coupling a voltage regulator to receive the first voltage and form the second voltage.

15. The method of claim 8 further including coupling a protection circuit to inhibit forming the second and fourth voltages until the third voltage reaches the third value.

16. The power supply circuit of claim 1 wherein the regulator circuit includes an amplifier coupled to receive the second voltage and the potential of the return as the operating voltage, the amplifier having a signal first input coupled to receive the first voltage and a second signal input coupled to receive the potential of the return as a reference signal.

17. A audio power supply circuit comprising:
a first input configured to receive an input voltage having a first value for operating the power supply circuit;

a return configured to form a common terminal for the input voltage wherein the first value is referenced to a potential of the return;

a first circuit configured to receive the input voltage and form a first voltage having a second value that is less than the first value, the second value having a first magnitude;

a second circuit configured to receive the input voltage and form a second voltage having a third value that is negative referenced to the potential of the return wherein a second magnitude of the third value is less than the first value;

a reference circuit configured to receive the input voltage and form a reference voltage having a fourth value that is less than the first value;

a regulator circuit configured to use the potential of the return and the second voltage as an operating voltage, the regulator circuit configured to receive the reference voltage and form a third voltage that is negative referenced to the potential of the return and having a third magnitude that is substantially equal to the first magnitude; and an audio system configured to receive the first voltage as a positive operating voltage and the third voltage as a negative operating voltage so that the audio system is coupled between the first and third voltages to receive power to operate the audio system.

\* \* \* \* \*